(12) United States Patent
Zhang et al.

(10) Patent No.: US 11,139,358 B2
(45) Date of Patent: Oct. 5, 2021

(54) DISPLAY PANEL AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventors: Ming Zhang, Hubei (CN); Jie Yang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 462 days.

(21) Appl. No.: 16/308,904

(22) PCT Filed: Sep. 25, 2018

(86) PCT No.: PCT/CN2018/107313
§ 371 (c)(1),
(2) Date: Dec. 11, 2018

(87) PCT Pub. No.: WO2020/042259
PCT Pub. Date: Mar. 5, 2020

(65) Prior Publication Data
US 2021/0226096 A1 Jul. 22, 2021

(30) Foreign Application Priority Data
Aug. 31, 2018 (CN) .......................... 201811015567.0

(51) Int. Cl.
H01L 27/32 (2006.01)
G02B 1/00 (2006.01)
(Continued)

(52) U.S. Cl.
CPC .......... *H01L 27/3272* (2013.01); *G02B 1/002* (2013.01); *G02B 5/283* (2013.01);
(Continued)

(58) Field of Classification Search
CPC ........ H01L 33/10; H01L 33/44; H01L 33/46; H01L 33/48; H01L 33/52; H01L 33/60;
(Continued)

(56) References Cited

U.S. PATENT DOCUMENTS

2011/0081532 A1* 4/2011 Lu ...................... C23C 14/3414
428/216
2014/0353637 A1 12/2014 Kawata
(Continued)

FOREIGN PATENT DOCUMENTS

| CN | 103500745 A | 1/2014 |
| CN | 104425316 A | 3/2015 |
| CN | 106024704 A | 10/2016 |

*Primary Examiner* — Eduardo A Rodela

(57) ABSTRACT

A display panel and a manufacturing method for the display panel are provided. The display panel includes a substrate. An ultraviolet reflective layer is disposed on the substrate. A thin film transistor array is disposed on the ultraviolet reflective layer. A light emitting device is disposed on the thin film transistor. An encapsulation layer is disposed on the light emitting device. The ultraviolet reflective layer includes at least one pair of a first reflective layer and a second reflective layer stacked on each other. The refractive indexes of the first reflective layer and the second reflective layer are different.

18 Claims, 5 Drawing Sheets

(51) Int. Cl.
*G02B 5/28* (2006.01)
*H01L 33/46* (2010.01)
*H01L 33/52* (2010.01)
*H01L 27/12* (2006.01)
*H01L 33/60* (2010.01)
*H01L 27/146* (2006.01)

(52) U.S. Cl.
CPC .... *H01L 27/1218* (2013.01); *H01L 27/14623* (2013.01); *H01L 27/14629* (2013.01); *H01L 33/46* (2013.01); *H01L 33/52* (2013.01); *H01L 33/60* (2013.01); *H01L 2933/0025* (2013.01)

(58) Field of Classification Search
CPC .............. H01L 33/0093; H01L 27/1218; H01L 27/146; H01L 27/1462; H01L 27/14623; H01L 27/14625; H01L 27/1259; H01L 27/1266; H01L 27/3272; H01L 2021/775; H01L 51/5265; H01L 51/5271; H01L 51/5284; H01L 51/5281; H01L 31/1892; H01L 31/1896; G02B 5/283; G02B 1/002
See application file for complete search history.

(56) References Cited

U.S. PATENT DOCUMENTS

2015/0187849 A1    7/2015   Kachatryan et al.
2015/0380439 A1*   12/2015   Chen .................. H01L 27/1222
                                                               257/72

* cited by examiner

DISPLAY PANEL AND MANUFACTURING METHOD THEREOF

BACKGROUND OF THE DISCLOSURE

1. Field of the Disclosure

The present disclosure is related to the field of display, and in particular to a display panel and a manufacturing method thereof.

2. Description of the Related Art

Currently, flexible display panels are often coated with a layer of flexible material (PI) on a glass substrate. After completing the manufacturing processes of a thin film transistor, a light emitting device, an encapsulation layer, etc., the PI is cauterized by a laser lift off technique (Laser Lift Off, LLO), and the glass substrate is stripped in order to obtain a display panel. Since an absorption rate of UV light by the PI material is as high as 80%, and therefore an equipment currently used in LLO is an ultraviolet laser stripping device.

In the production of the display panel, a setting of an intensity of a laser in an ultraviolet laser stripping apparatus has a stricter requirement. A low-energy laser causes unsuccessfully stripping of a rigid substrate, and a high-energy laser adversely influences the film, for example, changes in adhesion of a gel material and defects of the thin film transistor array, which bring some problems regarding flexibility and reliability of the display panel. Therefore, in the stripping process of the rigid substrate, it is necessary to strictly control the laser energy in the LLO process.

SUMMARY

A display panel and a manufacturing method thereof are provided, so as to resolve some problems that a laser light damages the structure of the display panel when a rigid substrate is stripped in the existing display panel.

According to an aspect of the present disclosure, a display panel is provided, includes:
a substrate;
an ultraviolet reflective layer disposed on the substrate;
a thin film transistor array disposed on the ultraviolet reflective layer, and the thin film transistor array includes a thin film transistor;
a light emitting device disposed on the thin film transistor; and an encapsulation layer disposed on the light emitting device;
wherein the ultraviolet reflective layer includes at least one pair of a first reflective layer and a second reflective layer stacked on each other, refractive indexes of the first reflective layer and the second reflective layer are different, and a difference of the refractive indexes of the first reflective layer and the second reflective layer is more than or equal to 0.2.

According to an embodiment of the present disclosure, further including a supplementary substrate disposed between the first reflective layer and the second reflective layer, and a material of the supplementary substrate is the same as a material of the substrate.

According to an embodiment of the present disclosure, the supplementary substrate is disposed between the ultraviolet reflective layer and the thin film transistor.

According to an embodiment of the present disclosure, the first reflective layer includes one of a silicon oxide and an aluminum oxide, and the second reflective layer includes one of a titanium oxide, a zirconium oxide, and a zinc oxide.

According to an embodiment of the present disclosure, the first reflective layer and the second reflective layer satisfy a formula below:
$\lambda=2(n_1 d_1+n_2 d_2)$, wherein the $\lambda$ is a laser wavelength, the $n_1$ is a material refractive index of the first reflective layer, the $n_2$ is a material refractive index of the second reflective layer, the $d_1$ is a film thickness of the first reflective layer, and the $d_2$ is a film thickness of the second reflective layer.

According to an embodiment of the present disclosure, the laser wavelength is 280 nm-300 nm, the material refractive index of the first reflective layer is 1.4-1.6, the material refractive index of the second reflective layer is 1.9-2.1, and the film thickness of the first reflective layer is 1 nm-100 nm.

According to another aspect of the present disclosure, a display panel is provided, includes:
a substrate;
an ultraviolet reflective layer disposed on the substrate;
a thin film transistor array disposed on the ultraviolet reflective layer, and the thin film transistor array comprising a thin film transistor;
a light emitting device disposed on the thin film transistor; and
an encapsulation layer disposed on the light emitting device;
wherein the ultraviolet reflective layer includes at least one pair of a first reflective layer and a second reflective layer stacked on each other, refractive indexes of the first reflective layer and the second reflective layer are different.

According to an embodiment of the present disclosure, further including a supplementary substrate disposed between the first reflective layer and the second reflective layer, and a material of the supplementary substrate is the same as a material of the substrate.

According to an embodiment of the present disclosure, the supplementary substrate is disposed between the ultraviolet reflective layer and the thin film transistor.

According to an embodiment of the present disclosure, the first reflective layer includes one of a silicon oxide and an aluminum oxide, and the second reflective layer includes one of a titanium oxide, a zirconium oxide, and a zinc oxide.

According to an embodiment of the present disclosure, the first reflective layer and the second reflective layer satisfy a formula below:
$\lambda=2(n_1 d_1+n_2 d_2)$, wherein the $\lambda$ is a laser wavelength, the $n_1$ is a material refractive index of the first reflective layer, the $n_2$ is a material refractive index of the second reflective layer, the $d_1$ is a film thickness of the first reflective layer, and the $d_2$ is a film thickness of the second reflective layer.

According to an embodiment of the present disclosure, the laser wavelength is 280 nm-300 nm, the material refractive index of the first reflective layer is 1.4-1.6, the material refractive index of the second reflective layer is 1.9-2.1, and the film thickness of the first reflective layer is 1 nm-100 nm.

According to an embodiment of the present disclosure, a manufacturing method for display panel is provided, includes:
S10, providing a rigid substrate and forming a substrate on the rigid substrate;
S20, forming an ultraviolet reflective layer on the substrate, the ultraviolet reflective layer includes at least one pair of a first reflective layer and a second reflective layer stacked on each other;
S30, forming a thin film transistor array, a light emitting device and an encapsulation layer on the ultraviolet reflective layer sequentially; and
S40, stripping the rigid substrate by a laser lift-off technique;

wherein refractive indexes of the first reflective layer and the second reflective layer are different, and the first reflective layer and the second reflective layer satisfy a formula below: $\lambda=2(n_1d_1+n_2d_2)$, wherein the $\lambda$ is a laser wavelength, the $n_1$ is a material refractive index of the first reflective layer, the $n_2$ is a material refractive index of the second reflective layer, the $d_1$ is a film thickness of the first reflective layer, and the $d_2$ is a film thickness of the second reflective layer.

According to an embodiment of the present disclosure, the step S20 also includes forming a supplementary substrate between the first reflective layer and the second reflective layer during the formation of the ultraviolet reflective layer, and a material for forming the supplementary substrate is the same as a material for forming the substrate.

According to an embodiment of the present disclosure, the step S20 also includes: disposing the supplementary substrate on the ultraviolet reflective layer.

According to an embodiment of the present disclosure, the first reflective layer includes one of a silicon oxide and aluminum oxide, and the second reflective layer includes one of a titanium oxide, a zirconium oxide, and a zinc oxide.

According to an embodiment of the present disclosure, the display panel also includes a supplementary substrate disposed between the first reflective layer and the second reflective layer, and the material of the supplementary substrate is the same as the material of the substrate.

According to an embodiment of the present disclosure, the display panel also comprises the supplementary substrate, which is disposed between the ultraviolet reflective layer and the thin film transistor.

According to an embodiment of the present disclosure, the laser wavelength is 280 nm-300 nm, a material refractive index of the first reflective layer is 1.4-1.6, a material refractive index of the second reflective layer is 1.9-2.1, and a film thickness of the first reflective layer is 1 nm-100 nm.

Beneficial effects: in the present disclosure, an ultraviolet reflective layer for reflecting excess laser light is disposed between the substrate and the thin film transistor array so as to avoid the problem that the laser damages the structure of the display panel during the rigid substrate stripping process.

BRIEF DESCRIPTION OF THE DRAWINGS

In order to clearly illustrate the embodiments and technical solutions in the prior art, brief description of the drawings are used in the embodiments or the description of prior art will be given below. Obviously, the drawings in the following description are only some embodiments of the invention. In the case of without providing creative work, those of ordinary skill in the art can obtain other drawings according to these drawings.

DETAILED DESCRIPTION OF THE EMBODIMENTS

Figure 1:
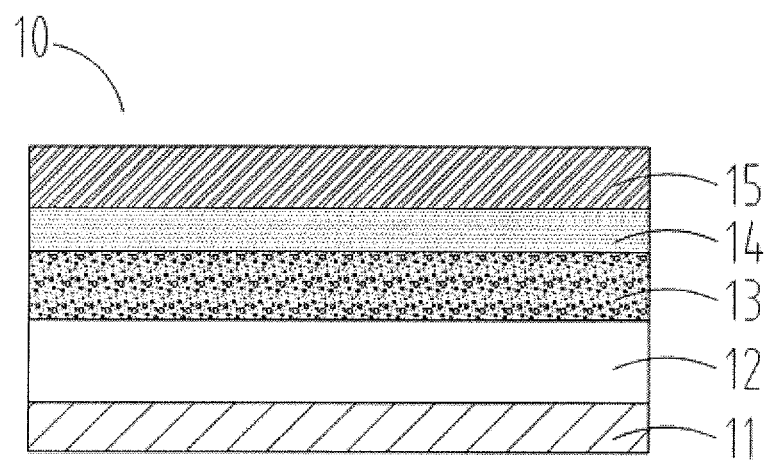
FIG. 1 is a schematic view of a structure of a display panel according to a first embodiment of the present disclosure.

The following description of each embodiment refers to the additional drawings, in order to illustrate the specific embodiments that may be implemented by the present disclosure. The directional terms mentioned in this invention, such as [upper], [lower], [front], [post], [left], [right], [inside], [outside], [side], etc., are only refers to the direction of the additional drawings. Therefore, the terms are used to illustrate and understand the present invention, not to limit the present invention. In the drawings, structurally similar elements are denoted by the same reference numerals.

A display panel and a manufacturing method thereof are provided in the present disclosure, so as to resolve some problems that a laser light damages the structure of the display panel when a rigid substrate is stripped in the existing display panel, and the present embodiments improve the defect thereof.

In order to further describe the present disclosure, the following will combine the drawings and specific embodiments for describe the present disclosure in detail.

With reference to FIG. 1, and FIG. 1 is a schematic view of a structure of a display panel according to a first embodiment of the present disclosure.

In the first embodiment of the present disclosure, the present disclosure provides a display panel 10, including:

a substrate 11, which is a flexible substrate. In one embodiment, a manufacturing material of the flexible substrate includes polyimide, which is used as a carrier for other film structures, and the flexible substrate prepared by polyimide has better thermal stability and flexibility.

In one embodiment, a film thickness of the substrate 11 is 1 nm-100 nm.

An ultraviolet reflective 12 layer is disposed on the substrate 11.

In order to prevent excessive laser energy from damaging other structures of the OLED panel during the rigid substrate stripping process, in the present disclosure, an ultraviolet reflective layer 12 having an ultraviolet reflecting function is disposed on the substrate.

Figure 2:
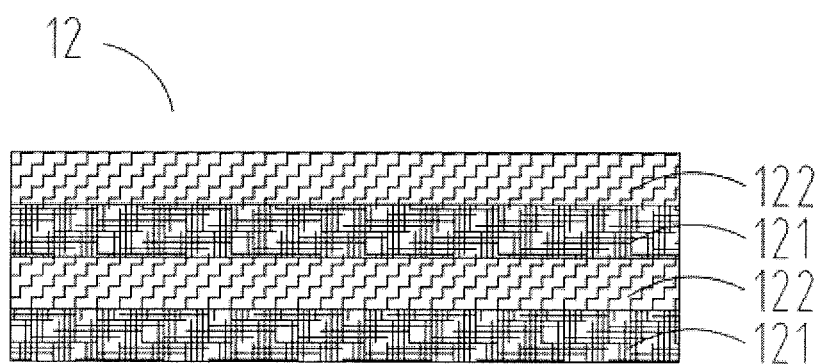
FIG. 2 is a schematic view of a structure of an ultraviolet reflective layer according to the first embodiment of the present disclosure.

With reference to FIG. 2, FIG. 2 is a schematic view of a structure of an ultraviolet reflective layer according to the first embodiment of the present disclosure.

In one embodiment, the ultraviolet reflective layer 12 includes at least one pair of a first reflective layer 121 and a second reflective layer 122 stacked on each other, refractive indexes of the first reflective layer 121 and the second reflective layer 122 are different.

The present disclosure is provided by the first reflective layer 121 and the second reflective layer 122 stacked on each other. During the refraction of the ultraviolet light, the ultraviolet light is greatly absorbed because the difference in the refractive indexes of the reflective layers so as to improve the performance of the display panel.

In one embodiment, the first reflective layer 121 and the second reflective layer 122 satisfy a formula below:

$$\lambda=2(n_1d_1+n_2d_2)$$

wherein the λ is a laser wavelength, the $n_1$ is a material refractive index of the first reflective layer 121, the $n_2$ is a material refractive index of the second reflective layer 122, the $d_1$ is a film thickness of the first reflective layer 121, and the $d_2$ is a film thickness of the second reflective layer 122.

In one embodiment, when a first layer in the ultraviolet reflective layer 12 is not specifically limited, the first layer of the ultraviolet reflective layer 12 may be the first reflective layer 121 or the second reflective layer 122.

In one embodiment, the laser wavelength is 280 nm-300 nm.

In one embodiment, a material refractive index of the first reflective layer 121 is 1.4-1.6.

In one embodiment, a material refractive index of the second reflective layer 122 is 1.9-2.1

In one embodiment, a film thickness of the first reflective layer 121 is 1 nm-100 nm.

In one embodiment, a film thickness of the second reflective layer 122 is calculated by the above formula.

Figure 3:
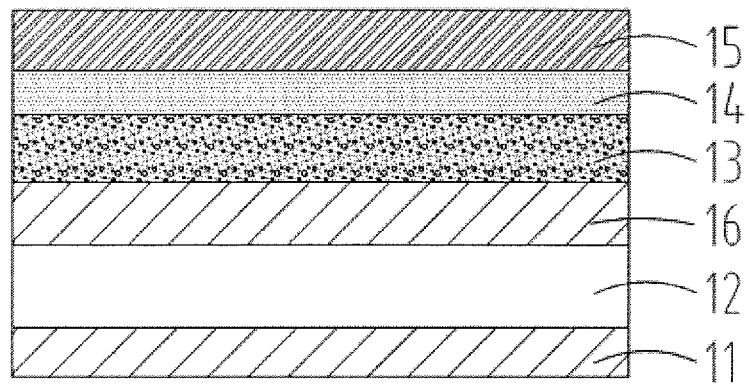
FIG. 3 is a schematic view of a structure a display panel according to a second embodiment of the present disclosure.

With reference to FIG. 3, FIG. 3 is a schematic view of a structure of a display panel according to a second embodiment of the present disclosure.

The display panel 1 also includes a supplementary substrate 16 which is disposed on the ultraviolet reflective layer 12. A material of the supplementary substrate 16 is the same as a material of the substrate 11.

Figure 4:
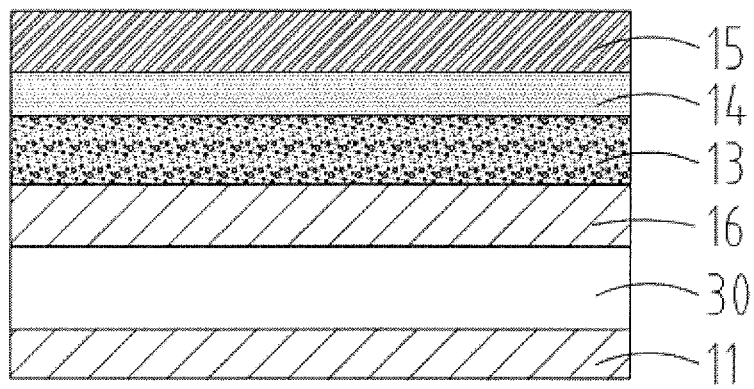
FIG. 4 is a schematic view of a structure of a display panel according to a third embodiment of the present disclosure.

With reference to FIG. 4, FIG. 4 is a schematic view of a structure of a display panel according to a third embodiment of the present disclosure.

The supplementary substrate 16 is not only disposed in the ultraviolet reflective layer 12, but also disposed between a first reflective layer 121 and a second reflective layer 122 of the ultraviolet reflective layer 12. The supplementary substrate 16 is also disposed in the ultraviolet reflective layer 12 and between the first reflective layer 121 and the second reflective layer 122 at the same time.

The above structural configuration is arranged according to the specific requirements of the display panel 10, and no specific limitation is imposed. In one embodiment, the supplementary substrate 16, the first reflective layer 121 and the second reflective layer 121 are arbitrarily combined.

It is noted that when the supplementary substrate 16, the first reflective layer 121, and the second reflective layer 122 are arbitrarily arranged, the limitation is required not to make the films of same material contact each other so as to optimize the laser reflective index.

Figure 5:
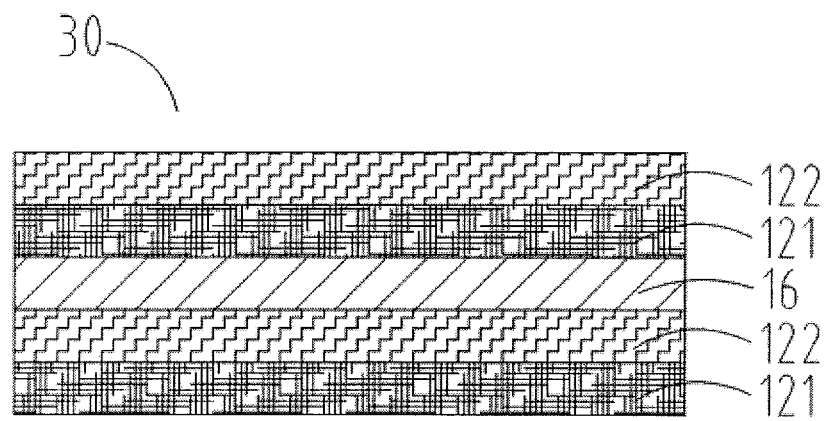
FIG. 5 is schematic view of a structure of a part of the display panel according to the third embodiment of the present disclosure.

With reference to FIG. 5, which is a schematic view of a structure of a part of the display panel according to the third embodiment of the present disclosure.

When the supplementary substrate 16 is disposed between the first reflective layer 121 and the second reflective layer 121, an ultraviolet reflective layer region including the supplementary substrate 16 is defined as a part 30, and the structure of the part 30 is shown in FIG. 5. Here, the specific position of the supplementary substrate 16 at which layer is not limited and the specific position can be arranged according to actual requirements.

Figure 6:
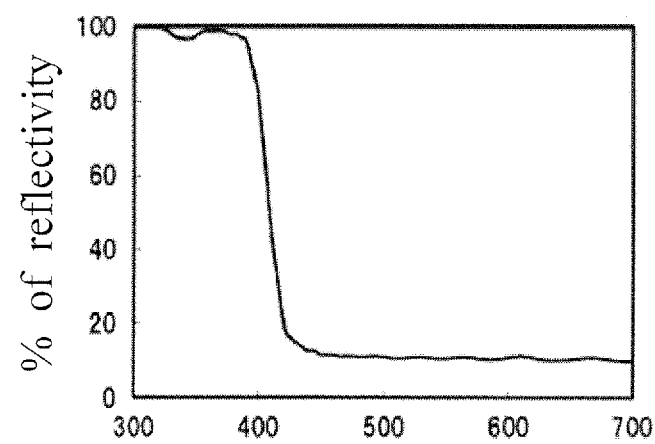
FIG. 6 is a graph of reflection effect of reflectivity of an ultraviolet reflection layer to laser with different wavelengths according to the present disclosure.

With reference to FIG. 6, FIG. 6 is a graph of reflection effect of reflectivity of an ultraviolet reflection layer to laser with different wavelengths according to the present disclosure. The ultraviolet reflective layer nearly has a 100% reflectivity to the laser in the wavelength range of 280 nm-320 nm, and thus can well protect other components of the display panel 10.

In one embodiment, the first reflective layer 121 includes one of a silicon oxide and an aluminum oxide. The second reflective layer 122 includes one of a titanium oxide, a zirconium oxide, and a zinc oxide.

In one embodiment, a difference of the refractive indexes of the first reflective layer and the second reflective layer is more than or equal to 0.2.

In one embodiment, the display panel further includes a thin film transistor array 13 disposed on the ultraviolet reflective layer 12. The thin film transistor array 13 further includes a thin film transistor.

A light emitting device 14 is disposed on the thin film transistor.

An encapsulation layer 15 is disposed on the light emitting device, and the encapsulation layer 15 is used for protecting the light emitting device 14 from erosion of external moisture.

Figure 7:
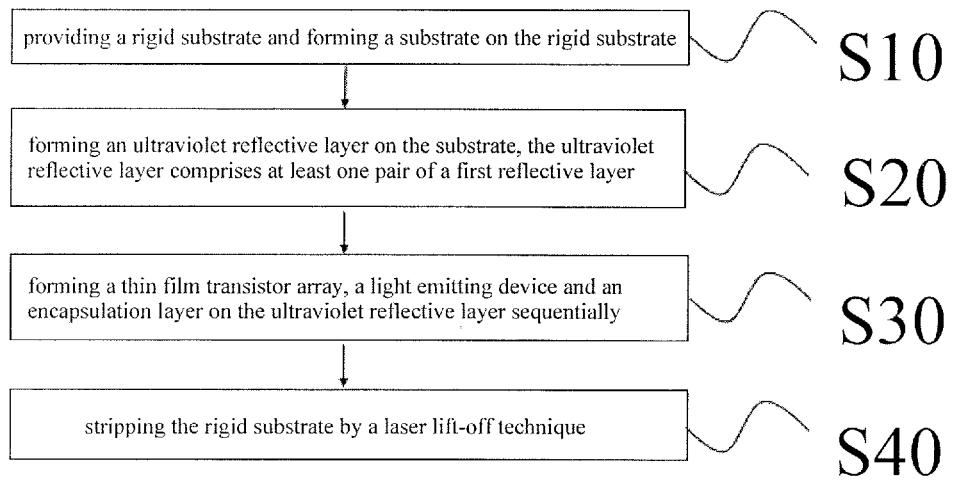
FIG. 7 is a flow chart of a manufacturing method of a display panel according to a fourth embodiment.

With reference to FIG. 7, FIG. 7 is a flow chart of a manufacturing method of a display panel according to the fourth embodiment.

A manufacturing method for the display panel is also provided, which includes:

with reference to FIGS. 8a-8d, and FIGS. 8a-8d are schematic views showing structures of the display panel obtained from the manufacturing method according to the fourth embodiment of the present disclosure.

Step S10 is related to providing a rigid substrate 20 and forming a substrate 11 on the rigid substrate.

Figure 8A:
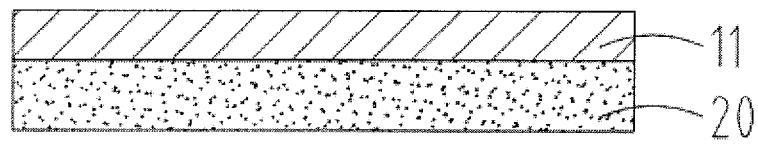
FIGS. 8a-8d are schematic views showing structures of the display panel obtained from the manufacturing method according to the fourth embodiment of the present disclosure.

With reference to FIG. 8a, the rigid substrate 20 is usually a glass substrate in this step. Before the substrate 11 is formed on the rigid substrate 20, the rigid substrate 20 needs to be clean.

In step S20, an ultraviolet reflective layer 12 is formed on the substrate 11, and the ultraviolet reflective layer 12 includes at least one pair of a first reflective layer 121 and a second reflective layer 122 stacked on each other.

Figure 8B:
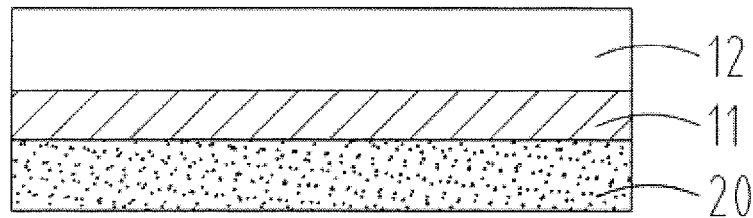
Figure 8C:
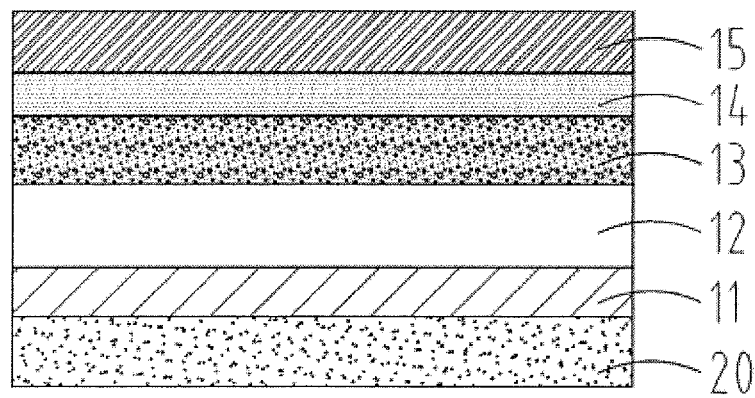
Figure 8D:
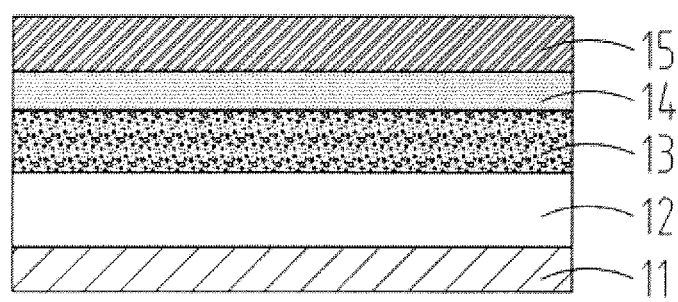

With reference to FIG. 8b, in this step, while forming the violet light reflecting layer 12, a supplementary substrate 16 is formed between the first reflective layer 121 and the second reflective layer 122, and a material of the supplementary substrate 16 is the same as a material of the substrate 11.

In one embodiment, the step further includes: forming the substrate 16 on the ultraviolet reflective layer 12.

Step S30 is related to forming a thin film transistor array 13, a light emitting device 14 and an encapsulation layer 15 on the ultraviolet reflective layer 12 sequentially.

Step S40 is related to stripping the rigid substrate 20 by a laser lift-off technique.

In one embodiment, refractive indexes of the first reflective layer 121 and the second reflective layer 122 are different and the first reflective layer 121 and the second reflective layer 122 satisfy the formula below:

$\lambda = 2(n_1 d_1 + n_2 d_2)$, wherein the λ is a laser wavelength, the $n_1$ is a material refractive index of the first reflective layer 121, the $n_2$ is a material refractive index of the second reflective layer 122, the $d_1$ is a film thickness of the first reflective layer 121, and the $d_2$ is a film thickness of the second reflective layer 122.

In one embodiment, the first reflective layer 121 and the second reflective layer 122 are prepared by one of a physical vapor deposition, chemical vapor deposition and wet film-forming technology.

A display panel and a manufacturing method thereof are provided in the present disclosure. An ultraviolet reflective layer for reflecting excess laser light is disposed between the substrate and the thin film transistor array so as to avoid the problem that the laser damages the structure of the display panel during the rigid substrate stripping process.

In summary, although the present disclosure has been disclosed in the above embodiments, the above embodiments are not used to limit the present disclosure. A person skilled in the art can make various modifications and refinements without departing from the spirit and scope of the present disclosure, and the scope of protection of the present disclosure is defined by the claims.

What is claimed is:

1. A display panel, comprising:
   a substrate;
   an ultraviolet reflective layer disposed on the substrate;
   a thin film transistor array disposed on the ultraviolet reflective layer, and the thin film transistor array comprising a thin film transistor;
   a light emitting device disposed on the thin film transistor; and
   an encapsulation layer disposed on the light emitting device;
   wherein the ultraviolet reflective layer comprises at least one pair of a first reflective layer and a second reflective layer stacked on each other, refractive indexes of the first reflective layer and the second reflective layer are different, and a difference of the refractive indexes of the first reflective layer and the second reflective layer is more than or equal to 0.2;
   wherein a supplementary substrate disposed between the first reflective layer and the second reflective layer, and a material of the supplementary substrate is the same as a material of the substrate.

2. The display panel as claimed in claim 1, wherein the supplementary substrate is disposed between the ultraviolet reflective layer and the thin film transistor.

3. The display panel as claimed in claim 1, wherein the first reflective layer comprises one of a silicon oxide and an aluminum oxide, and the second reflective layer comprises one of a titanium oxide, a zirconium oxide, and a zinc oxide.

4. The display panel as claimed in claim 1, wherein the first reflective layer and the second reflective layer satisfy a formula below:
   $\lambda=2(n_1 d_1+n_2 d_2)$, wherein the $\lambda$ is a laser wavelength, the $n_1$ is a material refractive index of the first reflective layer, the $n_2$ is a material refractive index of the second reflective layer, the $d_1$ is a film thickness of the first reflective layer, and the $d_2$ is a film thickness of the second reflective layer.

5. The display panel as claimed in claim 4, wherein the laser wavelength is 280 nm-300 nm, the material refractive index of the first reflective layer is 1.4-1.6, the material refractive index of the second reflective layer is 1.9-2.1, and the film thickness of the first reflective layer is 1 nm-100 nm.

6. A display panel, which comprising:
   a substrate;
   an ultraviolet reflective layer disposed on the substrate;
   a thin film transistor array disposed on the ultraviolet reflective layer, and the thin film transistor array comprising a thin film transistor;
   a light emitting device disposed on the thin film transistor; and
   an encapsulation layer disposed on the light emitting device;
   wherein the ultraviolet reflective layer comprises at least one pair of a first reflective layer and a second reflective layer stacked on each other, refractive indexes of the first reflective layer and the second reflective layer are different;
   wherein a supplementary substrate disposed between the first reflective layer and the second reflective layer, and a material of the supplementary substrate is the same as a material of the substrate.

7. The display panel as claimed in claim 6, wherein the supplementary substrate is disposed between the ultraviolet reflective layer and the thin film transistor.

8. The display panel as claimed in claim 6, wherein the first reflective layer comprises one of a silicon oxide and an aluminum oxide, and the second reflective layer comprises one of a titanium oxide, a zirconium oxide, and a zinc oxide.

9. The display panel as claimed in claim 6, wherein the first reflective layer and the second reflective layer satisfy a formula below:
   $\lambda=2(n_1 d_1+n_2 d_2)$, wherein the $\lambda$ is a laser wavelength, the $n_1$ is a material refractive index of the first reflective layer, the $n_2$ is a material refractive index of the second reflective layer, the $d_1$ is a film thickness of the first reflective layer, and the $d_2$ is a film thickness of the second reflective layer.

10. The display panel as claimed in claim 9, wherein the laser wavelength is 280 nm-300 nm, the material refractive index of the first reflective layer is 1.4-1.6, the material refractive index of the second reflective layer is 1.9-2.1, and the film thickness of the first reflective layer is 1 nm-100 nm.

11. The display panel as claimed in claim 6, wherein a difference of the refractive indexes of the first reflective layer and the second reflective layer is more than or equal to 0.2.

12. A manufacturing method for display panel comprising:
    S10, providing a rigid substrate and forming a substrate on the rigid substrate;
    S20, forming an ultraviolet reflective layer on the substrate, the ultraviolet reflective layer comprises at least one pair of a first reflective layer and a second reflective layer stacked on each other;
    S30, forming a thin film transistor array, a light emitting device and an encapsulation layer on the ultraviolet reflective layer sequentially; and
    S40, stripping the rigid substrate by a laser lift-off technique;
    wherein refractive indexes of the first reflective layer and the second reflective layer are different, and the first reflective layer and the second reflective layer satisfy a formula below:
    $\lambda=2(n_1 d_1+n_2 d_2)$, wherein the $\lambda$ is a laser wavelength, the $n_1$ is a material refractive index of the first reflective layer, the $n_2$ is a material refractive index of the second reflective layer, the $d_1$ is a film thickness of the first reflective layer, and the $d_2$ is a film thickness of the second reflective layer.

13. The manufacturing method as claimed in claim 12, wherein the step S20 comprises forming a supplementary substrate between the first reflective layer and the second reflective layer during the formation of the ultraviolet reflective layer, and a material for forming the supplementary substrate is the same as a material for forming the substrate.

14. The manufacturing method as claimed in claim 13, wherein the step S20 also comprises:
    disposing the supplementary substrate on the ultraviolet reflective layer.

15. The manufacturing method as claimed in claim 13, wherein the first reflective layer comprises one of a silicon oxide and aluminum oxide, and the second reflective layer comprises one of a titanium oxide, a zirconium oxide, and a zinc oxide.

16. The manufacturing method as claimed in claim 13, wherein the display panel also comprises the supplementary substrate disposed between the first reflective layer and the second reflective layer, and the material of a supplementary substrate is the same as a material of the substrate.

17. The manufacturing method as claimed in claim 13, wherein the display panel also comprises the supplementary substrate, which is disposed between the ultraviolet reflective layer and the thin film transistor.

18. The manufacturing method as claimed in claim 13, wherein the laser wavelength is 280 nm-300 nm, a material refractive index of the first reflective layer is 1.4-1.6, a material refractive index of the second reflective layer is 1.9-2.1, and a film thickness of the first reflective layer is 1 nm-100 nm.

* * * * *